United States Patent
Zeng et al.

(10) Patent No.: US 11,881,046 B2
(45) Date of Patent: Jan. 23, 2024

(54) OPTICAL MODULE AND MOBILE TERMINAL

(71) Applicant: VIVO MOBILE COMMUNICATION CO., LTD., Chang'an Dongguan (CN)

(72) Inventors: Qiang Zeng, Chang'an Dongguan (CN); Yongnian Yi, Chang'an Dongguan (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 77 days.

(21) Appl. No.: 17/550,757

(22) Filed: Dec. 14, 2021

(65) Prior Publication Data

US 2022/0101647 A1    Mar. 31, 2022

Related U.S. Application Data

(63) Continuation of application No. PCT/CN2020/085675, filed on Apr. 20, 2020.

(30) Foreign Application Priority Data

Jun. 28, 2019 (CN) .......................... 201910579374.6

(51) Int. Cl.
*G06V 40/13* (2022.01)
*H01L 27/146* (2006.01)
*G06V 10/147* (2022.01)

(52) U.S. Cl.
CPC ........ *G06V 40/1318* (2022.01); *G06V 10/147* (2022.01); *H01L 27/1462* (2013.01); *H01L 27/14625* (2013.01); *H01L 27/14636* (2013.01); *H01L 27/14678* (2013.01)

(58) Field of Classification Search
CPC .............. G06V 40/1318; G06V 10/147; H01L 27/1462; H01L 27/14625; H01L 27/14636; H01L 27/14678
See application file for complete search history.

(56) References Cited

U.S. PATENT DOCUMENTS

| | | | |
|---|---|---|---|
| 2016/0224816 A1 | 8/2016 | Smith | |
| 2016/0254312 A1* | 9/2016 | Lee | H01L 27/14687 382/125 |
| 2017/0017824 A1 | 1/2017 | Smith et al. | |
| 2018/0120149 A1* | 5/2018 | Chung | G01S 17/04 |

(Continued)

FOREIGN PATENT DOCUMENTS

| | | |
|---|---|---|
| CN | 107563361 A | 1/2018 |
| CN | 107844767 A | 3/2018 |

(Continued)

OTHER PUBLICATIONS

Chinese Search Report related to Application No. 201910579374.6; dated Mar. 20, 2020.

(Continued)

*Primary Examiner* — Stephen G Sherman
(74) *Attorney, Agent, or Firm* — von Briesen & Roper, s.c.

(57) ABSTRACT

An optical module and a mobile terminal are provided. The optical module includes a collimator, a photosensitive unit, and a wiring structure, wherein the photosensitive unit is arranged on a surface of one side of the collimator, and the wiring structure is arranged on a surface of one side, away from the collimator, of the photosensitive unit.

13 Claims, 1 Drawing Sheet

(56) References Cited

U.S. PATENT DOCUMENTS

| | | | |
|---|---|---|---|
| 2018/0175125 A1* | 6/2018 | Chung | ............... G06V 40/12 |
| 2019/0180072 A1 | 6/2019 | Fomani | |
| 2019/0303640 A1* | 10/2019 | Song | ............ G06V 40/1318 |
| 2020/0097699 A1 | 3/2020 | Zeng et al. | |
| 2020/0218873 A1 | 7/2020 | Guo | |
| 2020/0342195 A1 | 10/2020 | Wu | |

FOREIGN PATENT DOCUMENTS

| | | | |
|---|---|---|---|
| CN | 107958184 A | 4/2018 | |
| CN | 108537171 A | 9/2018 | |
| CN | 109271057 A | 1/2019 | |
| CN | 109284734 A | 1/2019 | |
| CN | 109308431 A | 2/2019 | |
| CN | 109416737 A | 3/2019 | |
| CN | 109508578 A | 3/2019 | |
| CN | 109753919 A | 5/2019 | |
| CN | 109791611 A | 5/2019 | |
| CN | 208888832 U | 5/2019 | |
| CN | 109844765 A | 6/2019 | |
| CN | 109863507 A | 6/2019 | |
| CN | 110321832 A | 10/2019 | |
| CN | 209746551 U | 12/2019 | |
| JP | H0536872 A | 2/1993 | |
| JP | H05250618 A | 2/1993 | |
| JP | H1169988 A | 3/1999 | |
| WO | 2017129126 A1 | 8/2017 | |
| WO | WO-2019124715 A1 * | 6/2019 | ........... G06K 9/0002 |

OTHER PUBLICATIONS

First Chinese Office Action related to Application No. 201910579374.6; dated Nov. 5, 2020.

International Search Report and Written Opinion related to Application No. PCT/CN2020/085675; dated Jun. 29, 2020.

Extended European Search Report related to Application No. 20832796.5 dated Jul. 15, 2022.

Indian Office Action related to Application No. 202127060244 dated Jun. 14, 2022.

Japanese Notice of Reasons for Refusal for related Application No. 2021-570473; dated Jun. 7, 2023.

* cited by examiner

OPTICAL MODULE AND MOBILE TERMINAL

CROSS-REFERENCE TO RELATED APPLICATIONS

This application is a continuation application of International Application No. PCT/CN2020/085675 filed on Apr. 20, 2020, which claims priority to Chinese Patent Application No. 201910579374.6, filed in China on Jun. 28, 2019, which is incorporated herein by reference in its entirety.

TECHNICAL FIELD

The present disclosure relates to the field of communication technology, and in particular, relates to an optical module and a mobile terminal.

BACKGROUND

An optical module such as a fingerprint module is one of core components of a mobile terminal. With the continuous development of the mobile terminal industry, people have growing performance requirements for optical modules, which brings a larger challenge to structural design of optical modules.

A fingerprint module is used as an example. The fingerprint module in the related art usually includes a bearer substrate, a photosensitive unit, a wiring structure, and a collimator. The photosensitive unit and the wiring structure are both arranged on a surface, facing the collimator, of the bearer substrate, and the collimator is located between a display screen and the photosensitive unit. When a user puts a finger onto a fingerprint sensing area, light is reflected by the user's fingerprint, and enters the photosensitive unit through the light passing hole opened in the collimator to obtain fingerprint information.

One surface of the collimator is bonded to the display screen by using an adhesive, and the other surface is bonded to the photosensitive unit, the wiring structure and the bearer substrate by using an adhesive. Thicknesses of the adhesive on both sides of the collimator are relatively large. As a result, a thickness of the entire optical module is relatively large, and space occupied by the optical module increases accordingly.

SUMMARY

The present disclosure discloses an optical module and a mobile terminal.

The following technical solutions are used in the present disclosure.

An optical module is provided, including a collimator, a photosensitive unit, and a wiring structure. The photosensitive unit is arranged on a surface of one side of the collimator, and the wiring structure is arranged on a surface of one side, away from the collimator, of the photosensitive unit.

Optionally, the wiring structure is bonded to the photosensitive unit.

Optionally, a wiring protection layer is further included, and the wiring protection layer is arranged on a surface of one side, away from the photosensitive unit, of the wiring structure.

Optionally, a circuit board is further included, the circuit board is connected to the wiring structure, and the circuit board and the wiring protection layer are located on a same side of the wiring structure.

Optionally, a part of the wiring structure is bonded to the circuit board, and another part of the wiring structure is bonded to the wiring protection layer.

Optionally, a filtering layer is further included, and the filtering layer is arranged on a surface of one side, away from the photosensitive unit, of the collimator.

Optionally, a filtering layer is further included, and the filtering layer is arranged between the collimator and the photosensitive unit.

Optionally, at least one of the photosensitive unit and the wiring structure is a plating structure.

Optionally, the optical module is a fingerprint module.

A mobile terminal is provided, including a display screen and an optical module arranged on the display screen, where the optical module is the optical module according to any one of the foregoing implementations.

Optionally, the optical module is bonded to the display screen by using an adhesive.

BRIEF DESCRIPTION OF DRAWINGS

The accompanying drawings described herein are used to provide a further understanding of the present disclosure and constitute a part of the present disclosure. The illustrative embodiments of the present disclosure and descriptions thereof are used to explain the present disclosure, and do not constitute any improper limitation on the present disclosure. In the accompanying drawings.

REFERENCE SIGNS

100—collimator, 110—light passing hole, 200—photosensitive unit, 300—wiring structure, 400—circuit board, 500—wiring protection layer, 600—display screen, 700—adhesive.

DESCRIPTION OF EMBODIMENTS

To make the objectives, technical solutions, and advantages of the present disclosure clearer, the following clearly describes the technical solutions in the present disclosure with reference to specific embodiments of the present disclosure and the corresponding accompanying drawings. Apparently, the described embodiments are some rather than all of the embodiments of the present disclosure. All other embodiments obtained by a person of ordinary skilled in the art based on the embodiments of the present disclosure without creative efforts shall fall within the protection scope of the present disclosure.

The technical solutions disclosed in the embodiments of the present disclosure are described in detail with reference to the accompanying drawings.

Figure 1:
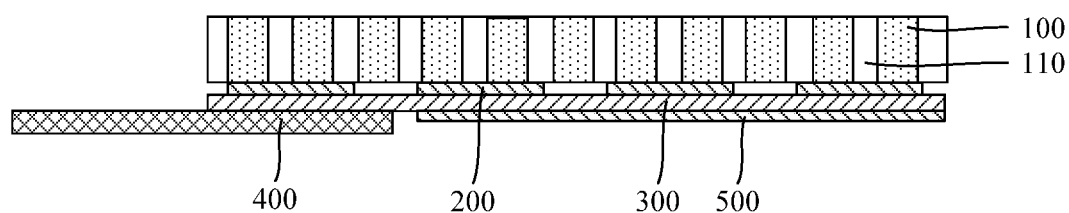
FIG. 1 is a schematic structural diagram of an optical module disclosed in an embodiment of the present disclosure.
Figure 2:
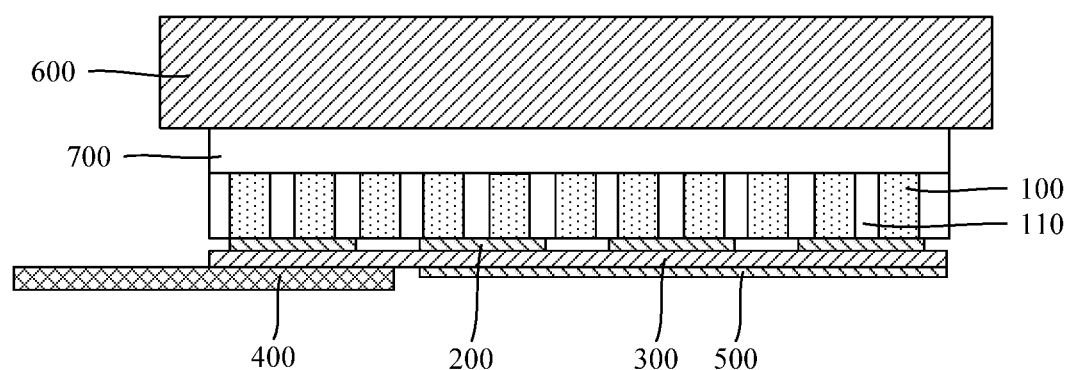
FIG. 2 is a schematic structural diagram of a part of a mobile terminal disclosed in an embodiment of the present disclosure.

As shown in FIG. 1, an embodiment of the present disclosure discloses an optical module. The optical module may specifically be a fingerprint module, and the fingerprint module can be applied to a mobile terminal to identify a user's fingerprint information, thereby helping determine whether the user's access is valid, so as to ensure security of the mobile terminal. As shown in FIG. 2, the optical module may be installed under a display screen 600 of the mobile terminal. Specifically, the display screen 600 has a fingerprint recognition area, and the optical module may be installed at the fingerprint recognition area.

Specifically, the optical module may include a collimator 100, a photosensitive unit 200, a wiring structure 300, and a circuit board 400. The photosensitive unit 200 is arranged on a surface of one side of the collimator 100, and the wiring structure 300 is arranged on a surface of one side, away from the collimator 100, of the photosensitive unit 200. In other words, the photosensitive unit 200 may be directly formed on the surface of one side of the collimator 100, or may be formed on the surface of one side of the collimator 100 by using another structure. There may be a plurality of photosensitive units 200, and the photosensitive units 200 may be arranged at intervals between the collimator 100 and the wiring structure 300. Specific quantity and size of the photosensitive units 200 can be designed according to a specific structure of the optical module, and are not limited herein. The circuit board 400 is electrically connected to the wiring structure 300, and can be further electrically connected to the photosensitive unit 200 through the wiring structure 300 to transmit signals. The circuit board 400 may be connected to a motherboard of the mobile terminal.

The collimator 100 is provided with a plurality of light passing holes 110, and axes of the light passing holes 110 may be perpendicular to the photosensitive unit 200. The photosensitive unit 200 can sense light, and can convert a light signal into an electrical signal. The fingerprint module is used as an example of the optical module. When a user puts a finger onto the fingerprint recognition area of the mobile terminal, light emitted by a light source of the mobile terminal is reflected by the user's fingerprint, and the reflected light carries fingerprint information of the user. When the reflected light passing through the collimator 100, only light with an angle approximately perpendicular to the photosensitive unit 200 (namely, light with a good perpendicular effect) can pass through the collimator 100 through the light passing hole 110. The light passed through the collimator 100 can shine on the photosensitive unit 200, and the photosensitive unit 200 senses a light signal, and then converts the light signal representing the fingerprint information into an electrical signal. The electrical signal can be transmitted to the motherboard of the mobile terminal through the circuit board 400. The motherboard can determine whether the obtained fingerprint information is consistent with a prestored fingerprint information, so as to determine whether the user's access operation is valid.

It can be learned from the foregoing content that, in the optical module disclosed in this embodiment of the present disclosure, the photosensitive unit 200 and the wiring structure 300 are directly formed on a surface of one side of the collimator 100. Therefore, it is not necessary to bond the photosensitive unit 200 and the wiring structure 300 to the collimator 100 through an adhesive, and it is also not necessary to add a bearer substrate for molding the photosensitive unit 200 and the wiring structure 300, so that a thickness of the entire optical module is reduced, and therefore the optical module occupies smaller space. In a specific embodiment, a thickness of an adhesive between a photosensitive unit 200 and wiring structure 300 and a collimator 100 in the related art is approximately 0.03 mm to 0.1 mm, and a thickness of a bearer substrate in the related art is approximately 0.1 mm. Therefore, a thickness of an optical module can be reduced by 0.13 mm to 0.2 mm.

In addition, after the adhesive between the photosensitive unit 200, the wiring structure 300 and the collimator 100 is left out, a distance between the photosensitive unit 200, the wiring structure 300 and the display screen 600 of the mobile terminal is smaller, and therefore signal strength is higher and photosensitivity efficiency of the optical module is higher. User experience is improved accordingly.

Because the wiring structure 300 is relatively thin, if the wiring structure 300 is directly exposed to the outside, the wiring structure 300 is likely to be damaged during an assembly process and during the use of the mobile terminal. To protect the wiring structure 300, the optical module may further include a wiring protection layer 500, and the wiring protection layer 500 is arranged on a surface of one side, away from the photosensitive unit 200, of the wiring structure 300 to cover at least a part of the wiring structure 300, so that the wiring structure 300 is not likely to be damaged.

According to the foregoing content, the wiring structure 300 needs to be connected to the photosensitive unit 200, the circuit board 400, and the wiring protection layer 500. If the circuit board 400 is connected to a surface, facing the photosensitive unit 200, of the wiring structure 300, a part of the wiring structure 300 which used to connect to the photosensitive unit 200 becomes smaller, resulting in a limitation on the quantity and size of the photosensitive units 200. To solve this problem, the circuit board 400 can be connected to a surface of one side, away from the photosensitive unit 200, of the wiring structure 300, so that the circuit board 400 and the wiring protection layer 500 are located on the same side of the wiring structure 300. After such an arrangement, connection between the wiring structure 300 and the photosensitive unit 200 is not restricted, and connection between the circuit board 400 and the wiring structure 300 is also not restricted. A connection area between the circuit board 400 and the wiring structure 300 can even be appropriately increased, so that the connection between them is more reliable.

The wiring protection layer 500 and the circuit board 400 are connected to a same side of the wiring structure 300, the connection area between the circuit board 400 and the wiring structure 300 affects reliability of the connection between them, and an area, covering the wiring structure 300, of the wiring protection layer 500 affects an effect of protecting the wiring structure 300. Therefore, in embodiments of the present disclosure, optionally, a surface, away from the photosensitive unit 200, of the wiring structure 300 includes a first part and a second part, and the first part and the second part together form the wiring structure 300. The circuit board 400 is connected to the first part, and the wiring protection layer 500 covers the second part. In other words, a part of the wiring structure 300 is bonded to the circuit board 400, and the other part of the wiring structure 300 is bonded to the wiring protection layer 500, so as to make full use of the surface of the wiring protection layer 500, thereby not only ensuring the reliability of the connection between the wiring protection layer 500 and the wiring structure 300 but also covering the rest of the wiring structure 300. Therefore, a protection effect can be improved. Certainly, there may be a small gap between the wiring protection layer 500 and the circuit board 400.

In a further embodiment, to improve photosensitivity accuracy, the optical module may further include a filtering layer (not shown in the figures), and the filtering layer may be arranged on a surface of one side, away from the photosensitive unit 200, of the collimator 100. In this case, the photosensitive unit 200 can be directly formed on a surface of one side, away from the filtering layer, of the collimator 100. In another embodiment, the filtering layer may be arranged between the collimator 100 and the photosensitive unit 200. To be specific, the filtering layer can be formed on a surface of one side of the collimator 100, and the photosensitive unit 200 can be formed on a surface of one side, away from the collimator 100, of the filtering layer, so that the photosensitive unit 200 can be arranged on the collimator 100 through the filtering layer.

To mold the photosensitive unit 200 and the wiring structure 300 more conveniently and improve molding precision of the photosensitive unit 200 and the wiring structure 300, optionally, at least one of the photosensitive unit 200 and the wiring structure 300 is a plating structure. In other words, the photosensitive unit 200 and the wiring structure 300 can be molded by using a coating process. After such a processing technology is used, a thickness of the photosensitive unit 200 and the wiring structure 300 can be controlled to be about 3 um, so that the thickness of the optical module is further reduced.

An embodiment of the present disclosure further discloses a method for preparing an optical module. The preparation method is used to prepare the optical module described in any one of the foregoing embodiments, and the preparation method specifically includes:

preparing a collimator 100; and preparing the photosensitive unit 200 and the wiring structure 300 on a surface of one side of the collimator 100, so that the wiring structure 300 is located on one side, away from the collimator 100, of the photosensitive unit 200.

Specifically, after the preparation of the collimator 100 is completed, the photosensitive unit 200 and the wiring structure 300 can be directly formed on the collimator 100, or another structure (for example, the filtering layer described in the foregoing embodiment) can be first formed on the collimator 100, and then the photosensitive unit 200 and the wiring structure 300 are formed. In addition, a forming sequence of the photosensitive unit 200 and the wiring structure 300 can be flexibly designed. For example, the photosensitive unit 200 may be formed first, and then the wiring structure 300 is formed, or the photosensitive unit 200 and wiring structure 300 may be formed at the same time.

Based on the optical module in any one of the foregoing embodiments, as shown in FIG. 2, an embodiment of the present disclosure further discloses a mobile terminal. The mobile terminal may include a display screen 600 and an optical module arranged under the display screen 600, wherein the optical module may be the optical module according to any one of the foregoing embodiments. Because the thickness of the optical module becomes smaller, the thickness of the mobile terminal can be reduced accordingly, and other components in the mobile terminal can be arranged more conveniently. In addition, after the optical module is used, photosensitivity efficiency is higher when a user accesses the mobile terminal.

To improve assembling efficiency of the mobile terminal and reduce processing costs of the mobile terminal, the optical module can be bonded to the display screen 600 through an adhesive 700. The adhesive 700 can not only ensure strength of bonding between the optical module and the display screen 600 but also allow light to pass through.

The mobile terminal disclosed in this embodiment of the present disclosure may be a smartphone, a tablet computer, an ebook reader, or a wearable device. Certainly, the mobile terminal may alternatively be another device, which is not limited in this embodiment of the present disclosure.

The foregoing embodiments of the present disclosure focus on differences between various embodiments. Different optimization features of the various embodiments can be combined to form a better embodiment as long as they are not contradictory. Considering conciseness of description, details are not described herein.

The foregoing descriptions are merely embodiments of this disclosure, but are not intended to limit this disclosure. For a person skilled in the art, the present disclosure may have various changes and variations. Any modification, equivalent replacement, or improvement made without departing from the spirit and principle of this disclosure shall fall within the scope of claims of this disclosure.

What is claimed is:

1. An optical module, comprising a collimator, a photosensitive unit, and a wiring structure, wherein the photosensitive unit is arranged on a surface of one side of the collimator, and the wiring structure is arranged on a surface of one side, away from the collimator, of the photosensitive unit; wherein the photosensitive unit is directly formed on a surface of one side of the collimator;

wherein the optical module further comprises a wiring protection layer, wherein the wiring protection layer is arranged on a surface of one side, away from the photosensitive unit, of the wiring structure;

wherein the optical module further comprises a circuit board, wherein the circuit board is connected to the wiring structure, and the circuit board and the wiring protection layer are located on a same side of the wiring structure;

wherein a part of the wiring structure is bonded to the circuit board, and another part of the wiring structure is bonded to the wiring protection layer.

2. The optical module according to claim 1, wherein the wiring structure is bonded to the photosensitive unit.

3. The optical module according to claim 1, further comprising a filtering layer, wherein the filtering layer is arranged on a surface of one side, away from the photosensitive unit, of the collimator.

4. The optical module according to claim 1, further comprising a filtering layer, wherein the filtering layer is arranged between the collimator and the photosensitive unit.

5. The optical module according to claim 1, wherein at least one of the photosensitive unit and the wiring structure is a plating structure.

6. The optical module according to claim 1, wherein the optical module is a fingerprint module.

7. A mobile terminal, comprising a display screen and an optical module arranged under the display screen, wherein the optical module comprises a collimator, a photosensitive unit, and a wiring structure, wherein the photosensitive unit is arranged on a surface of one side of the collimator, and the wiring structure is arranged on a surface of one side, away from the collimator, of the photosensitive unit; wherein the photosensitive unit is directly formed on a surface of one side of the collimator;

wherein the optical module further comprises a wiring protection layer, and the wiring protection layer is arranged on a surface of one side, away from the photosensitive unit, of the wiring structure;

wherein the optical module further comprises a circuit board, and the circuit board is connected to the wiring structure, and the circuit board and the wiring protection layer are located on a same side of the wiring structure;

wherein a part of the wiring structure is bonded to the circuit board, and another part of the wiring structure is bonded to the wiring protection layer.

8. The mobile terminal according to claim 7, wherein the wiring structure is bonded to the photosensitive unit.

9. The mobile terminal according to claim 7, wherein the optical module further comprises a filtering layer, wherein the filtering layer is arranged on a surface of one side, away from the photosensitive unit, of the collimator.

10. The mobile terminal according to claim 7, wherein the optical module further comprises a filtering layer, wherein the filtering layer is arranged between the collimator and the photosensitive unit.

11. The mobile terminal according to claim 7, wherein at least one of the photosensitive unit and the wiring structure is a plating structure.

12. The mobile terminal according to claim 7, wherein the optical module is a fingerprint module.

13. The mobile terminal according to claim 7, wherein the optical module is bonded to the display screen by using an adhesive.

\* \* \* \* \*